United States Patent [19]
Fouts et al.

[11] Patent Number: 5,179,503
[45] Date of Patent: Jan. 12, 1993

[54] MODULAR AUTOMOBILE POWER DISTRIBUTION BOX

[75] Inventors: Mark E. Fouts, Farmington Hills; Thomas F. Rahrig, Woodhaven, both of Mich.; David E. Champlin, Montgomery, Ala.; Zenon Hotra, Troy, Mich.

[73] Assignee: United Technologies Automotive, Inc., Dearborn, Mich.

[21] Appl. No.: 687,817

[22] Filed: Apr. 19, 1991

[51] Int. Cl.⁵ .............................................. H05K 7/00
[52] U.S. Cl. .................................... 361/393; 361/331; 361/380; 361/394; 361/420; 361/426; 361/430; 361/431; 307/10.1; 307/150
[58] Field of Search ............... 361/331, 392, 393, 394, 361/396, 426, 430, 431, 380, 415, 417, 419, 420; 307/10.1, 150

[56] References Cited

U.S. PATENT DOCUMENTS

| | | | |
|---|---|---|---|
| 3,312,277 | 3/1965 | Chitouras et al. | 361/386 |
| 4,318,156 | 3/1982 | Gallagher | 361/358 |
| 4,689,718 | 8/1987 | Mane et al. | 361/360 |
| 4,972,295 | 11/1990 | Suguro et al. | 361/386 |

Primary Examiner—Leo P. Picard
Assistant Examiner—Young S. Whang
Attorney, Agent, or Firm—Ronald G. Cummings

[57] ABSTRACT

A modular automobile power distribution box having a housing for mounting a plurality of interchangeable support modules. Each support module is adapted for supporting a specific electrical component such as an ISO relay, a mini-fuse, a maxi-fuse, etc., and the support modules are uniform so as to permit interchangeable positioning within the housing for selective variation of combinations of electrical components.

26 Claims, 4 Drawing Sheets

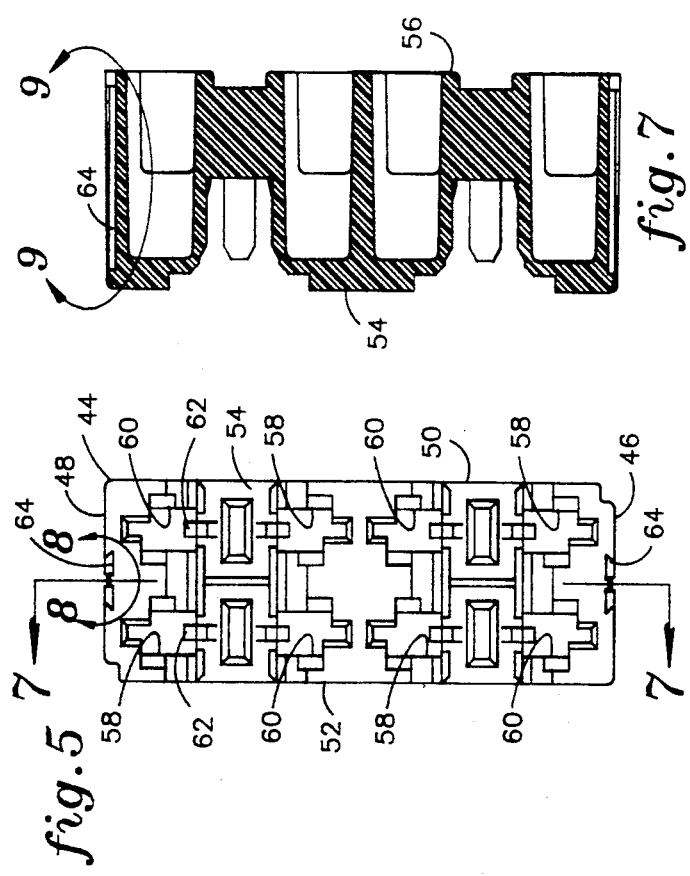
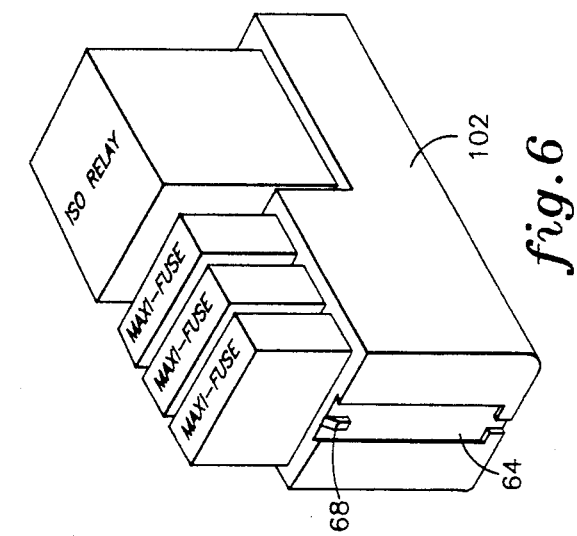
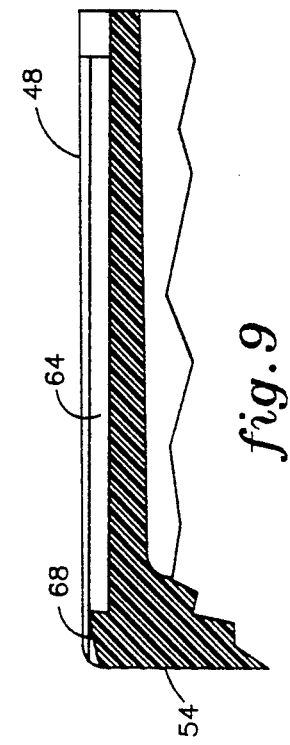
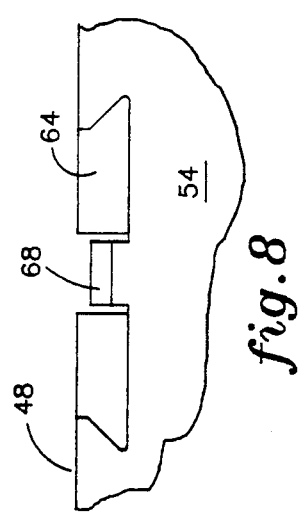

MODULAR AUTOMOBILE POWER DISTRIBUTION BOX

TECHNICAL FIELD

This invention relates to automobile wiring and more particularly to a modular power distribution box.

BACKGROUND AND SUMMARY OF THE INVENTION

Power distribution boxes are utilized in automobiles to distribute electrical power from the battery and alternator to the automobile electrical circuits. Generally, a power distribution box consists of a heat resistant plastic housing containing various electrical components such as fuses, relays, diodes, circuit breakers, etc. and is connected to the battery, alternator and a master wire harness. The number and type of electrical components contained in the distribution box depends upon the electrical requirements of the particular automobile.

Presently, distribution box housings are designed to be unique to the respective automobile model and are unable to accommodate changes in electrical components. Changes to a housing require new tooling each time. Typically, the box housing has an apertured support surface for plug-in mounting of the electrical components and this support surface is integrally molded with the housing walls. Any changes in the number or type of electrical components would thus necessitate a new box design which requires new tooling, etc. As such, present housings are unable to accommodate changes in component requirements and require costly new tooling for each change.

It would therefore be desirable to provide a standardized distribution box which affords flexibility in the selection and positioning of electrical components without redesign or retooling.

Accordingly, it is an object of the present invention to provide a modular power distribution box assembly for automotive applications.

Another object of the invention is to provide a modular distribution box with a standardized housing which facilitates design changes in electrical component requirements.

Another object of the invention is to provide a modular distribution box which eliminates or reduces new tooling requirements for design changes in electrical component requirements.

A further object of the invention is to provide a modular power distribution box which is economical to manufacture, easy to assemble and rigid in construction. Accordingly, it has been found that the foregoing and related objects are attained in a modular automobile power distribution box assembly having a housing configured to house a plurality of interchangeable support modules for mounting a variety of electrical components. A plurality of support modules are mounted to the housing to support electrical components for interconnection to automobile electrical systems. The modules are uniform so as to permit interchangeable positioning within the housing. In a preferred embodiment, the modules and housing are formed with a dovetail snap-lock mounting configuration for slidably positioning each module in snap-lock engagement with the housing. The dovetail connection includes a ramp and slight draft for drawing the housing and modules together to provide a rigid assembly.

BRIEF DESCRIPTION OF THE DRAWINGS

FIG. 5 is a plan view of an exemplary support module.

FIG. 6 is a diagrammatical perspective view of another exemplary support module.

FIG. 7 is a sectional view seen on line 7—7 of FIG. 5.

FIG. 8 is an enlarged fragmentary view from FIG. 5.

FIG. 9 is an enlarged fragmentary view from FIG. 7.

DESCRIPTION OF THE PREFERRED EMBODIMENT

Figure 1:
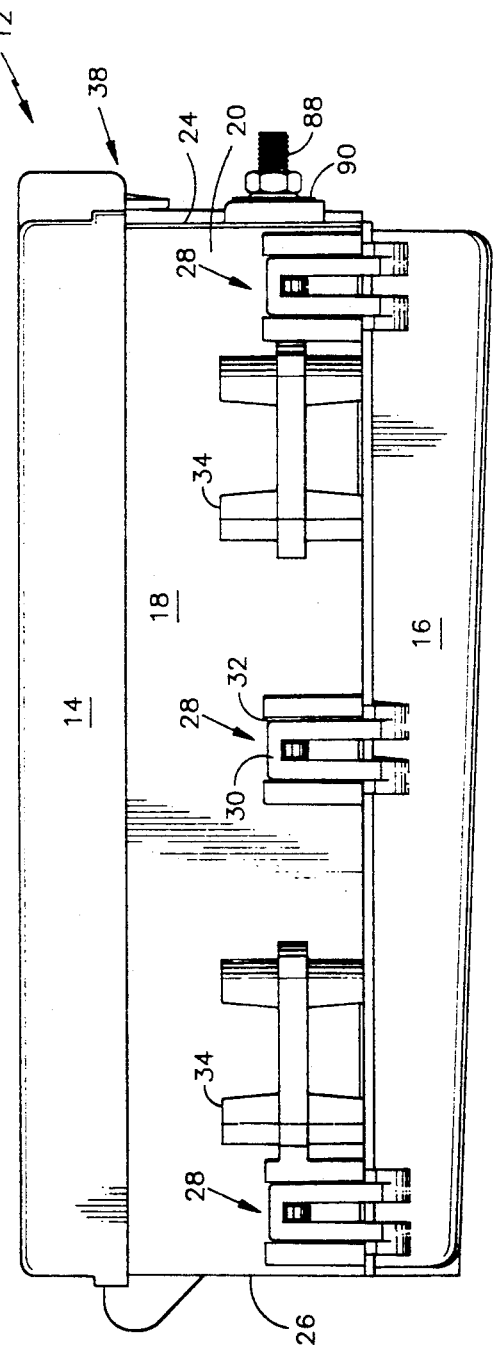
FIG. 1 is an elevational view of the power distribution box of the present invention.

Although specific forms of the present invention have been selected for illustration in the drawings, and the following description is drawn in specific terms for the purpose of describing these forms of the invention, the description is not intended to limit the scope of the invention which is defined in the appended claims.

Figure 2:
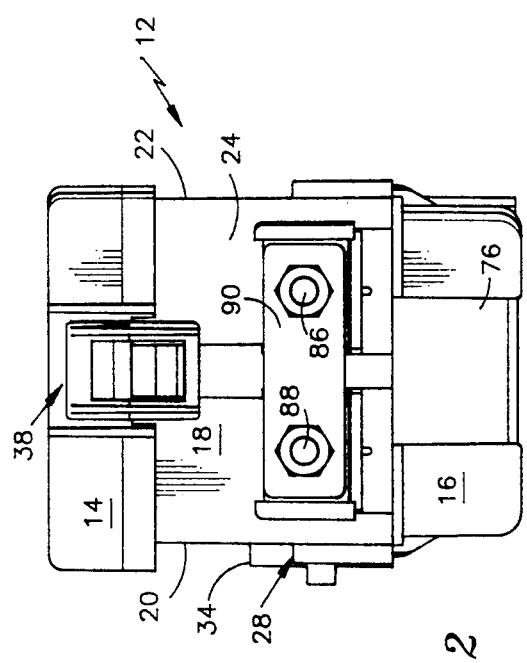
FIG. 2 is an end view of the box shown in FIG. 1.

The modular automobile power distribution box of the present invention generally comprises a housing, a plurality of interchangeable support modules mounted within the housing and a plurality of selected electrical components mounted to the support modules. Referring initially to FIGS. 1 and 2, the housing 12 includes a top cover 14, a bottom cover 16, and a frame member 18. The frame 18 has opposing front and rear walls 20, 22 and opposing side walls 24, 26 which are configured to house the support modules therebetween.

The bottom cover 16 is secured to the frame 18 by six snap-lock connectors 28 which include tabs 30 integrally formed on bottom 16 and locking slots 32 integrally formed on the front and rear walls of frame 18. Bracket mounts 34 are also integrally formed on front wall 20 for mounting the distribution box to the vehicle body. The top cover 14 is pivotally mounted to the frame 18 about pin 36 at end wall 26 for movement between an open and closed position. A releasable snap-lock connector 38 secures the top cover 14 to the frame 18 at end wall 24. The frame 18 is preferably made of glass-filled polyester and the covers 14, 16 are polyester. The top cover, frame and bottom cover are configured to form a splash proof enclosure and alternately may be configured to form a waterproof enclosure.

Figure 3:
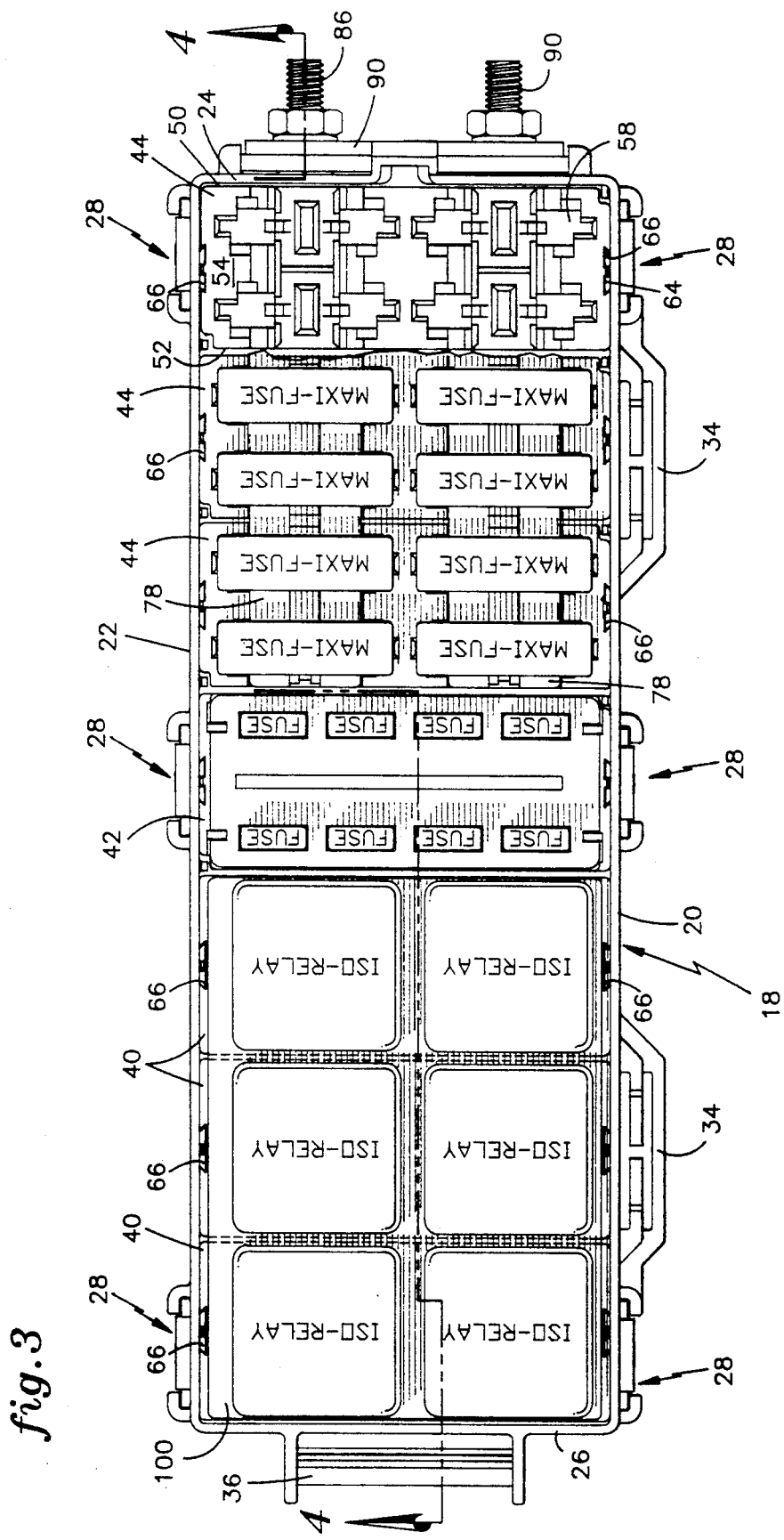
FIG. 3 is a partly broken away plan view of the box of FIG. 1 with the top cover removed.

Referring to FIG. 3, the frame 18 is configured to house seven support modules arranged side by side along the longitudinal axis of the frame 18. The seven modules utilized in the configuration of FIG. 3 comprise three ISO relay modules 40, one mini-fuse module 42 and three maxi-fuse modules 44. The modules have uniform cross-sectional dimensions so as to be physically interchangeable with each other in the configuration of FIG. 3.

The specific design of the modules varies depending upon the particular electrical components to be supported. For purposes of explanation, the module 44 for maxi-fuses shown in FIG. 5 will be described in detail and then compared to other types of modules. The module 44 is a generally rectangular-shaped molded piece having front and rear walls 46, 48, sides 50, 52 and top and bottom portions 54, 56. The top portion 54 contains four pairs of terminal apertures 58, 60 extending vertically through the module 44. Each pair of apertures 58, 60 are configured to mount female box terminals to receive the male blade terminals of a maxi-fuse. The apertures 60 are intended to mount a female box terminal which connects to a bus bar at its lower end and receives one terminal of a maxi-fuse at its upper end. The apertures 58 are intended to receive a female box terminal of a wire harness lead which receives the other male blade terminal of the respective maxi-fuse. The female box terminals are snap-lock mounted in the apertures 58, 60 by locking tabs 62.

Figure 4:
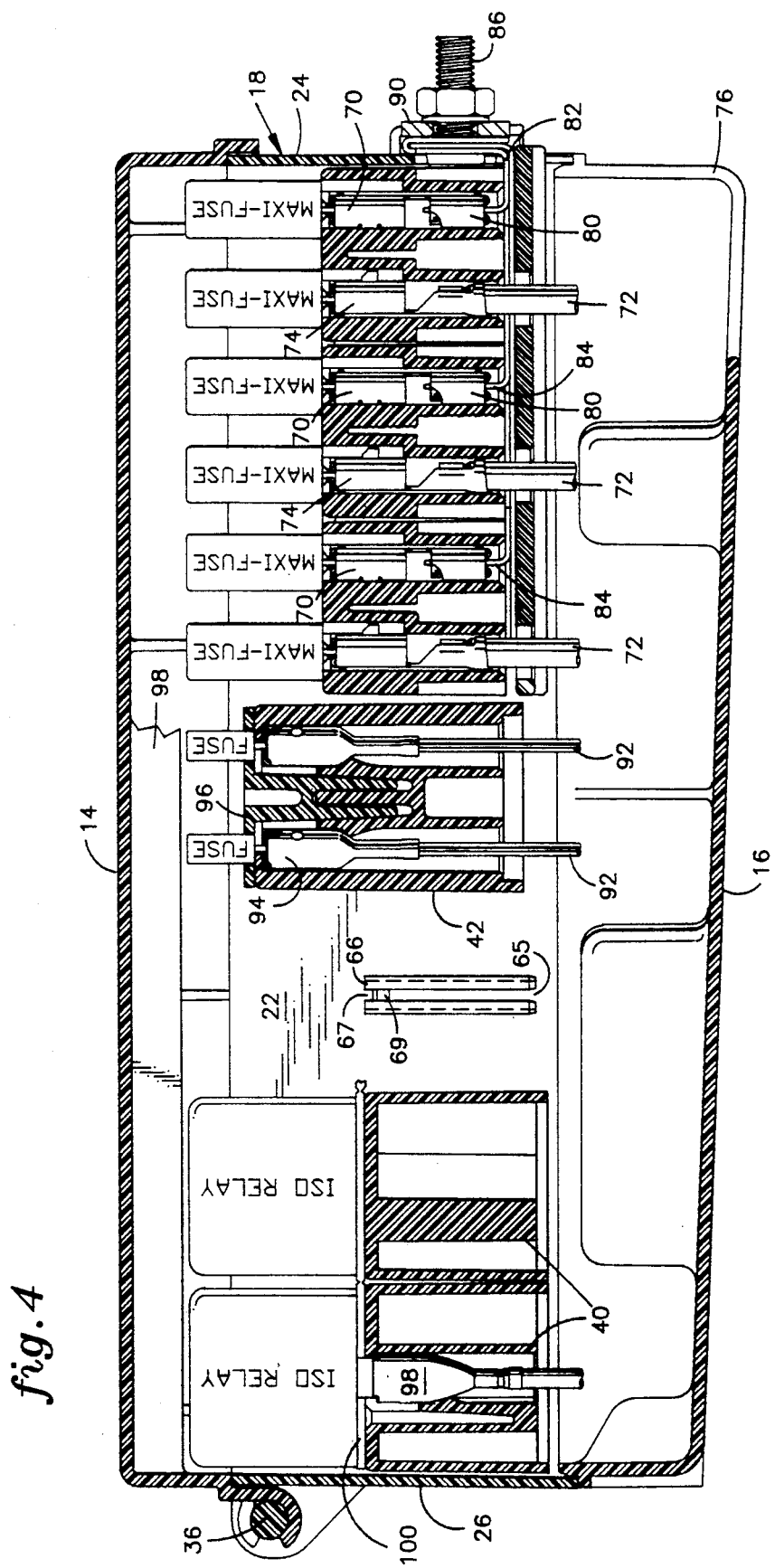
FIG. 4 is a partly broken away sectional view seen on line 4—4 of FIG. 3 with the top cover in place.

The front and rear walls 46, 48 of module 44 contain a vertically extending dovetail slot 64 for interconnection with corresponding dovetail tenons 66 on the front and rear walls 20, 22 of frame 18. Referring to FIG. 3, frame 18 has seven pairs of opposing dovetail tenons 66 which extend vertically on the inside surface of the front and rear walls (one of which is shown in FIG. 4). The pairs of tenons 66 are equi-spaced longitudinally along the axis of frame 18 to precisely position the modules within the frame.

Referring to FIGS. 4 and 8, the dovetail slot 64 includes a locking tab 68 for snap-lock engagement in a recess 67 in the dovetail tenon 66. The dovetail tenon 66 has a central groove 65 to pass the locking tab 68 and a ramp section 69 at its upper end to ramp tab 68 into snap-lock engagement to secure the module in the locked or assembled position shown in FIG. 4. The modules are inserted vertically from the bottom of frame 18 with the dovetail interconnection serving as a guide to slidably insert the module into position. The dovetail tenon and the dovetail slot exhibit a slight draft of approximately 0.5 degrees. The draft and the ramp section are infigured to draw the walls 20, 22 of the frame 18 toward the module as it is snap locked into position to tension the connection and form a rigid assembly.

Prior to inserting the modules 44 into the frame 18, a female box terminal 70 is mounted in each terminal aperture 60. The modules are then slidably inserted within the frame 18 into snap-lock engagement. The leads 72 of the wire harness which are intended for connection to the maxi-fuses terminate in a female box terminal 74. The leads 72 are routed through an opening 76 in bottom cover 16 and extend upwardly through terminal apertures 58 with the terminals 74 secured in snap-lock engagement with locking tab 62. The female box terminal 74 has a recess to receive the locking tab 62 in snap-lock engagement. While the terminals 74 are securely locked in apertures 58 by locking tab 62, a secondary locking feature is employed to ensure securement of the terminal. The secondary locking feature comprises a wedge insert 78 (FIG. 3) which is mounted on the top of module 44 and has a number of downwardly depending tabs which extend into the apertures 58, 60 to engage the locking tabs 62 to retain them in locking engagement with the terminals 70, 74. The wedge inserts 78 are appropriately slotted to allow the male blade terminals of the maxi-fuses to mount in the terminals 70, 74.

The lower ends 80 of terminal 70 are located at the bottom of module 44 and are connected to a bus bar 82. The bus bar 82 extends axially into the frame 18 and has upwardly extending male blade terminals 84 which connect to the lower ends 80 of terminals 70. The bus bar 82 is electrically connected to a threaded stud 86 for connection to the automobile battery. A second bus bar (not shown) extends parallel to bus bar 82 and terminates in threaded stud 88. Threaded stud 88 is connected to the alternator and a jumper plate 90 electrically connects the studs 86, 88 and thus the bus bars. In assembling the bus bar 82 to the terminals 70, the bus bar is simply pushed upwardly such that the male terminals 84 are slidably inserted into the lower ends 80 of the female box terminals 70. Since the dovetail connection between the module 44 and the frame 18 positions the module within a low tolerance range, the lower ends 80 of terminals 70 are precisely positioned to receive the male terminals of the bus bar 82.

The modules 40, 42 are configured similarly to module 44 with respect to the means for positioning and snap-lock mounting within the frame 18 and all modules have uniform horizontal cross-sectional dimensions (e.g., length and width as seen in FIG. 5). Similar to module 44, the modules 40, 42 contain a vertical dovetail slot and locking tab in the forward and rearward walls and can be mounted in any of the seven positions defined by the frame 18. The module 42 is configured to mount eight mini-fuses for interconnection to leads 92 of a wire harness. The leads 92 terminate in female box terminals 94 which are snap-lock mounted within the module 42 similar to the mounting of terminals 74 in module 44. A wedge member 96 functions as a secondary lock to secure terminals 94 in module 42 similar to the wedge 78 in module 44. The mini-fuses are then inserted through slots in the wedge member 96 into electrical and mechanical connection with the terminals 94. The mini-fuses serve to protect various circuits connected by the wire harness and are not directly connected to the bus bars 82 in the illustrated embodiment.

As seen in FIG. 4, the mini-fuses are considerably smaller than the maxi-fuses. The vertical height of module 42 is dimensioned to align the topmost surface of the mini-fuses with the topmost surface of the maxi-fuses. Similarly, the modules 40 which support the ISO relays are dimensioned so that the top surface of the ISO relays are in the same plane as the top surfaces of the mini-fuses and the maxi-fuses. The cover 14 of housing 12 has a plurality of downwardly depending ribs 98 which extend longitudinally between the end walls to adjoin or retentively engage the upper surfaces of the electrical components. The ribs 98 serve to further secure the electrical components in place in the respective modules.

The modules 40 are configured to support two ISO relays. Each ISO relay has five downwardly depending male blade terminals and, accordingly, the module 40 contains ten vertical terminal apertures to mount corresponding female box terminals 98 in snap-lock engagement. Similar to modules 42, 44, a wedge 100 is utilized as a secondary lock to retain the locking tabs of the module 40. The wedge 100 is apertured in a pattern corresponding to the terminals of the ISO relay to permit mechanical and electrical connection of the ISO relay to the terminals 98.

Referring to FIG. 6, a module 102 is diagrammatically shown with the dovetail slot 64 and locking tab 68 exaggerated for purposes of explanation. The module 102 is configured to mount two different types of electrical components as for example, an ISO relay and three maxi-fuses. The top of the module is stepped to align the upper surfaces of the electrical components in a common plane as previously described. As can be appreciated, interchangeable modules may be configured to mount a variety of other types of electrical components (such as diodes, circuit breakers, etc.) as well as various combinations of electrical components. Importantly, the modules are to be interchangeably mountable in the predetermined positions defined by frame 18.

In the event of design changes or new applications, the housing need not be redesigned, but need only be reconfigured with modules corresponding to the selected electrical components. Since the modules are interchangeably mountable in the housing, substantial flexability is available. New components need only require the tooling of a new module. If the number of components has changed, modules may be swapped or added as required. Housings may also be mounted together to increase module capacity.

Furthermore, while the present invention has been described in terms of an embodiment with a capacity of seven modules, it is to be understood that this configuration is merely exemplary and that the capacity and shape of a standardized housing for a modular distribution box may be determined by the specific applications. Alternately, the distribution box may be partially modular and partially fixed.

As can be seen, a modular power distribution box has been described which facilitates design changes in electrical component requirements and eliminates or reduces new tooling requirements for such changes. The distribution box is economical to manufacture, easy to assemble and rigid in construction.

As will be apparent to persons skilled in the art, various modifications and adaptations of the structure above described will become readily apparent without departure from the spirit and scope of the invention, the scope of which is defined in the appended claims.

What is claimed is:

1. A modular automobile power distribution box assembly comprising
   a housing having front and rear walls and opposing side walls configured to house a plurality of interchangeable support modules for mounting a variety of electrical components,
   a plurality of interchangeable support modules for mounting electrical components for interconnection to automobile electrical systems, said modules being uniform so as to permit interchangeable positioning within said housing for selectable variation of combinations of electrical components, and
   means for interchangeably mounting said modules within said housing so as to permit interchangeable positioning of support modules within said housing dependent upon selected electrical components to be mounted thereon.

2. The assembly of claim 1 wherein said modules are uniform in cross-sectional dimensions so as to permit interchangeable positioning within said housing.

3. The assembly of claim 1 wherein said mounting means comprises slide, snap-lock mounting means for slidably positioning each said module in snap-lock engagement with said housing.

4. The assembly of claim 1 wherein said mounting means comprises dovetail connection means for connecting said housing and said modules.

5. The assembly of claim 4 wherein said dovetail connection means is configured for tensioning the connection of said module and said housing.

6. The assembly of claim 1 wherein said housing has a top cover configured to retentively engage electrical components mounted within said housing.

7. The assembly of claim 1 wherein
   each said module has front and rear walls, opposing side walls and a top wall, said top wall being apertured for plug-in mounting of electrical components,
   each said module is configured to mount electrical components at a predetermined vertical height within said housing such that upper surfaces of mounted electrical components lie substantially in a plane, and
   said housing has a removable top cover with a lower surface configured to engage the upper surfaces of electrical components mounted therein to retain said electrical components in place on said modules.

8. The assembly of claim 7 wherein said lower surface of said cover has a plurality of longitudinal ribs to retentively engage the upper surface of electrical components.

9. The assembly of claim 1 comprising a plurality of selected electrical components mounted on said modules.

10. The assembly of claim 9 wherein said electrical components comprise a combination of iso relays and fuses.

11. The assembly of claim 9 comprising an automobile wire harness having a plurality of conductors terminating with terminals and mounted within said modules and electrically connected to said electrical components.

12. A method of assembling an automobile power distribution box of the type having a variety of electrical components, support modules for mounting electrical components and a housing, comprising the steps of
   selecting support modules corresponding to the electrical components to be mounted within said distribution box,
   positioning each module within said housing according to the type of electrical components to be mounted thereon,
   securing each module to said housing, and
   mounting the electrical components to the respective modules.

13. The method of claim 12 wherein the step of positioning each module within said housing comprises slidably inserting each module within said housing.

14. The method of claim 12 wherein the step of securing each module to said housing comprises snap-lock mounting each module to said housing.

15. The method of claim 12 further comprising mounting terminal connectors of a wiring harness within said module.

16. The method of claim 15 wherein the step of mounting the electrical components to the modules comprises plug-in mounting the electrical components into said modules and the terminal connectors of the wiring harness.

17. The method of claim 12 wherein the step of mounting the terminal connector within said modules comprises snap-lock mounting said connectors to said modules.

18. A modular automobile power distribution box assembly comprising
   a housing having front and rear walls and opposing side walls configured to house a plurality of interchangeable support modules for mounting a variety of electrical components,
   a plurality of interchangeable support modules for mounting electrical components for interconnection to automobile electrical systems, said modules being uniform so as to permit interchangeable positioning within said housing for selectable variation of combinations of electrical components, means for interchangeably mounting said modules within said housing so as to permit interchangeable positioning of support modules within said housing dependent upon selected electrical components to be mounted thereon, each said module having front and rear walls and opposing side walls, said module front wall being disposed adjacent said housing front wall and said module rear wall being disposed adjacent said housing rear wall, said mounting means comprising a first dovetail connection between said module front wall and said housing front wall and a second dovetail connection between said module rear wall and said housing rear wall, said first dovetail connection comprising a first dovetail slot on one of said module front wall and said housing front wall and a first dovetail tenon on the other of said module front wall and said housing front wall, said second dovetail connection comprising a second dovetail slot on one of said module rear wall on said housing rear wall and a second dovetail tenon on the other of said module rear wall and said housing rear wall, and said first and second dovetail connections being configured for slidable insertion of said dovetail tenons in said respective dovetail slots for slidably positioning said module within said housing.

19. The assembly of claim 18 wherein said first and second dovetail slots are formed in said front and rear wall, respectively, of said module and said first and second dovetail tenons are formed on said front and rear wall, respectively, of said housing.

20. The assembly of claim 18 wherein said first and second dovetail slots each have a ramp section configured to draw said housing front wall toward said module front wall and said housing rear wall toward said module rear wall when said module is slidably positioned in said housing.

21. The assembly of claim 20 wherein said mounting means comprise snap-lock means for snap-lock engagement between said module and said housing when said module is slidably positioned in said housing.

22. A modular automobile power distribution box assembly comprising
a housing having front and rear walls and opposing side walls configured to house a plurality of interchangeable support modules for mounting a variety of electrical components, and
a plurality of interchangeable support modules for mounting electrical components for interconnection to automobile electrical systems,
said modules being uniform so as to permit interchangeable positioning within said housing for selectable variation of combinations of electrical components, and
each said support module being configured for detachable interchangeable mounting to said housing.

23. The assembly of claim 22 wherein said modules are uniform in cross-sectional dimensions so as to permit interchangeable positioning within said housing.

24. The assembly of claim 22 wherein:
each said module has front and rear walls, opposing side walls and a top wall, said top wall being apertured for plug-in mounting of electrical components,
each said module is configured to mount electrical components at a predetermined vertical height within said housing such that upper surfaces of mounted electrical components lie substantially in a plane, and
said housing has a removable top cover with a lower surface configured to engage the upper surfaces of electrical components mounted therein to retain said electrical components in place on said modules.

25. The assembly of claim 24 wherein said lower surface of said cover has a plurality of longitudinal ribs to retentively engage the upper surface of electrical components.

26. The assembly of claim 22 comprising a plurality of selected electrical components mounted on said modules.

* * * * *

UNITED STATES PATENT AND TRADEMARK OFFICE
CERTIFICATE OF CORRECTION

PATENT NO. : 5,179,503

DATED : January 12, 1993

INVENTOR(S) : Fouts et al

It is certified that error appears in the above-identified patent and that said Letters Patent is hereby corrected as shown below:

Column 6, line 27, following "and" insert --connectors--.

Column 7, line 26 "on" (second occurrence) should be --and--.

Signed and Sealed this

Twenty-sixth Day of October, 1993

Attest:

Attesting Officer

BRUCE LEHMAN

Commissioner of Patents and Trademarks